(12) United States Patent
Subramanian et al.

(10) Patent No.: US 9,715,155 B1
(45) Date of Patent: Jul. 25, 2017

(54) ELECTRODE STRUCTURES FOR ELECTRO-OPTIC DISPLAYS

(71) Applicant: E INK CORPORATION, Billerica, MA (US)

(72) Inventors: Shyamala Subramanian, Arlington, MA (US); Ana L. Lattes, Newton, MA (US); Peter Carsten Bailey Widger, Nashua, NH (US); David Darrell Miller, Wakefield, MA (US)

(73) Assignee: E Ink Corporation, Billerica, MA (US)

( * ) Notice: Subject to any disclaimer, the term of this patent is extended or adjusted under 35 U.S.C. 154(b) by 0 days.

(21) Appl. No.: 14/796,356

(22) Filed: Jul. 10, 2015

Related U.S. Application Data

(63) Continuation-in-part of application No. 14/152,067, filed on Jan. 10, 2014.

(Continued)

(51) Int. Cl.
| | |
|---|---|
| *G02B 26/00* | (2006.01) |
| *G02B 26/08* | (2006.01) |
| *G02F 1/29* | (2006.01) |
| *G02F 1/167* | (2006.01) |
| *G02F 1/155* | (2006.01) |
| *G02F 1/1343* | (2006.01) |
| *G02B 5/20* | (2006.01) |
| *G02B 26/02* | (2006.01) |
| *H05K 1/02* | (2006.01) |
| *H05K 1/03* | (2006.01) |

(52) U.S. Cl.
CPC ............ *G02F 1/167* (2013.01); *G02B 5/201* (2013.01); *G02B 26/005* (2013.01); *G02B 26/026* (2013.01); *G02F 1/13439* (2013.01); *G02F 1/155* (2013.01); *H05K 1/0274* (2013.01); *H05K 1/0306* (2013.01); *H05K 1/0353* (2013.01); *G02F 2001/1676* (2013.01)

(58) Field of Classification Search
USPC ....... 359/290, 291, 292, 295, 296, 298, 237, 359/242, 245, 246, 247
See application file for complete search history.

(56) References Cited

U.S. PATENT DOCUMENTS

| | | |
|---|---|---|
| 4,418,346 A | 11/1983 | Batchelder |
| 5,760,761 A | 6/1998 | Sheridon |

(Continued)

FOREIGN PATENT DOCUMENTS

| | | |
|---|---|---|
| EP | 1 099 207 B1 | 3/2002 |
| EP | 1 145 072 B1 | 5/2003 |
| WO | WO 00/38000 | 6/2000 |

OTHER PUBLICATIONS

Bach, U., at al., "Nanomaterials-Based Electrochromics for Paper-Quality Displays", Adv. Mater, 14(11), 845 (2002).

(Continued)

*Primary Examiner* — Joseph P Martinez
*Assistant Examiner* — Brandi Thomas
(74) *Attorney, Agent, or Firm* — Zhen Bao

(57) ABSTRACT

Electrode sub-assemblies for use in electro-optic displays comprise an electrically non-conductive substrate, for example poly(ethylene terephthalate); a light-transmissive electrically-conductive ceramic layer, for example indium tin oxide; and a light-transmissive non-ceramic electrically-conductive layer, for example PEDOT:PSS.

13 Claims, 4 Drawing Sheets

Related U.S. Application Data

(60) Provisional application No. 62/022,924, filed on Jul. 10, 2014, provisional application No. 61/750,980, filed on Jan. 10, 2013.

(56) References Cited

U.S. PATENT DOCUMENTS

| | | | |
|---|---|---|---|
| 5,777,782 A | 7/1998 | Sheridon |
| 5,808,783 A | 9/1998 | Crowley |
| 5,872,552 A | 2/1999 | Gordon, II et al. |
| 6,054,071 A | 4/2000 | Mikkelsen, Jr. |
| 6,055,091 A | 4/2000 | Sheridon et al. |
| 6,097,531 A | 8/2000 | Sheridon |
| 6,124,851 A | 9/2000 | Jacobson |
| 6,128,124 A | 10/2000 | Silverman |
| 6,130,773 A | 10/2000 | Jacobson et al. |
| 6,130,774 A | 10/2000 | Albert et al. |
| 6,137,467 A | 10/2000 | Sheridon et al. |
| 6,144,361 A | 11/2000 | Gordon, II et al. |
| 6,147,791 A | 11/2000 | Sheridon |
| 6,172,798 B1 | 1/2001 | Albert et al. |
| 6,177,921 B1 | 1/2001 | Comiskey et al. |
| 6,184,856 B1 | 2/2001 | Gordon, II et al. |
| 6,225,971 B1 | 5/2001 | Gordon, II et al. |
| 6,232,950 B1 | 5/2001 | Albert et al. |
| 6,241,921 B1 | 6/2001 | Jacobson et al. |
| 6,252,564 B1 | 6/2001 | Albert et al. |
| 6,271,823 B1 | 8/2001 | Gordon, II et al. |
| 6,301,038 B1 | 10/2001 | Fitzmaurice et al. |
| 6,312,304 B1 | 11/2001 | Duthaler et al. |
| 6,312,971 B1 | 11/2001 | Amundson et al. |
| 6,376,828 B1 | 4/2002 | Comiskey |
| 6,392,786 B1 | 5/2002 | Albert |
| 6,413,790 B1 | 7/2002 | Duthaler et al. |
| 6,422,687 B1 | 7/2002 | Jacobson |
| 6,445,374 B2 | 9/2002 | Albert et al. |
| 6,480,182 B2 | 11/2002 | Turner et al. |
| 6,498,114 B1 | 12/2002 | Amundson et al. |
| 6,506,438 B2 | 1/2003 | Duthaler et al. |
| 6,518,949 B2 | 2/2003 | Drzaic |
| 6,521,489 B2 | 2/2003 | Duthaler et al. |
| 6,535,197 B1 | 3/2003 | Comiskey et al. |
| 6,545,291 B1 | 4/2003 | Amundson et al. |
| 6,639,578 B1 | 10/2003 | Comiskey et al. |
| 6,657,772 B2 | 12/2003 | Loxley |
| 6,664,944 B1 | 12/2003 | Albert et al. |
| D485,294 S | 1/2004 | Albert |
| 6,672,921 B1 | 1/2004 | Liang et al. |
| 6,680,725 B1 | 1/2004 | Jacobson |
| 6,683,333 B2 | 1/2004 | Kazlas et al. |
| 6,724,519 B1 | 4/2004 | Comiskey et al. |
| 6,750,473 B2 | 6/2004 | Amundson et al. |
| 6,788,449 B2 | 9/2004 | Liang et al. |
| 6,816,147 B2 | 11/2004 | Albert |
| 6,819,471 B2 | 11/2004 | Amundson et al. |
| 6,822,782 B2 | 11/2004 | Honeyman |
| 6,825,068 B2 | 11/2004 | Denis et al. |
| 6,831,769 B2 | 12/2004 | Holman et al. |
| 6,842,167 B2 | 1/2005 | Albert et al. |
| 6,842,279 B2 | 1/2005 | Amundson |
| 6,842,657 B1 | 1/2005 | Drzaic et al. |
| 6,865,010 B2 | 3/2005 | Duthaler et al. |
| 6,866,760 B2 | 3/2005 | Paolini Jr. et al. |
| 6,870,657 B1 | 3/2005 | Fitzmaurice et al. |
| 6,922,276 B2 | 7/2005 | Zhang et al. |
| 6,950,220 B2 | 9/2005 | Abramson et al. |
| 6,967,640 B2 | 11/2005 | Albert et al. |
| 6,980,196 B1 | 12/2005 | Turner et al. |
| 6,982,178 B2 | 1/2006 | LeCain et al. |
| 7,002,728 B2 | 2/2006 | Pullen et al. |
| 7,012,600 B2 | 3/2006 | Zehner et al. |
| 7,012,735 B2 | 3/2006 | Honeyman et al. |
| 7,030,412 B1 | 4/2006 | Drzaic et al. |
| 7,075,502 B1 | 7/2006 | Drzaic et al. |
| 7,075,703 B2 | 7/2006 | O'Neil et al. |
| 7,106,296 B1 | 9/2006 | Jacobson |
| 7,110,163 B2 | 9/2006 | Webber et al. |
| 7,116,318 B2 | 10/2006 | Amundson et al. |
| 7,119,772 B2 | 10/2006 | Amundson et al. |
| 7,148,128 B2 | 12/2006 | Jacobson |
| 7,167,155 B1 | 1/2007 | Albert et al. |
| 7,170,670 B2 | 1/2007 | Webber |
| 7,173,752 B2 | 2/2007 | Doshi et al. |
| 7,176,880 B2 | 2/2007 | Amundson et al. |
| 7,190,008 B2 | 3/2007 | Amundson et al. |
| 7,206,119 B2 | 4/2007 | Honeyman et al. |
| 7,223,672 B2 | 5/2007 | Kazlas et al. |
| 7,230,751 B2 | 6/2007 | Whitesides et al. |
| 7,236,291 B2 | 6/2007 | Kaga et al. |
| 7,256,766 B2 | 8/2007 | Albert et al. |
| 7,259,744 B2 | 8/2007 | Arango et al. |
| 7,280,094 B2 | 10/2007 | Albert |
| 7,312,784 B2 | 12/2007 | Baucom et al. |
| 7,321,459 B2 | 1/2008 | Masuda et al. |
| 7,327,511 B2 | 2/2008 | Whitesides et al. |
| 7,339,715 B2 | 3/2008 | Webber et al. |
| 7,349,148 B2 | 3/2008 | Doshi et al. |
| 7,352,353 B2 | 4/2008 | Albert et al. |
| 7,365,394 B2 | 4/2008 | Denis et al. |
| 7,365,733 B2 | 4/2008 | Duthaler et al. |
| 7,382,363 B2 | 6/2008 | Albert et al. |
| 7,388,572 B2 | 6/2008 | Duthaler et al. |
| 7,411,719 B2 | 8/2008 | Paolini, Jr. et al. |
| 7,420,549 B2 | 9/2008 | Jacobson et al. |
| 7,442,587 B2 | 10/2008 | Amundson et al. |
| 7,453,445 B2 | 11/2008 | Amundson |
| 7,492,497 B2 | 2/2009 | Paolini, Jr. et al. |
| 7,535,624 B2 | 5/2009 | Amundson et al. |
| 7,551,346 B2 | 6/2009 | Fazel et al. |
| 7,554,712 B2 | 6/2009 | Patry et al. |
| 7,561,324 B2 | 7/2009 | Duthaler et al. |
| 7,564,614 B2 | 7/2009 | Chen et al. |
| 7,583,427 B2 | 9/2009 | Danner et al. |
| 7,598,173 B2 | 10/2009 | Ritenour et al. |
| 7,605,799 B2 | 10/2009 | Amundson et al. |
| 7,636,191 B2 | 12/2009 | Duthaler |
| 7,649,674 B2 | 1/2010 | Danner et al. |
| 7,667,886 B2 | 2/2010 | Danner et al. |
| 7,670,505 B2 | 3/2010 | Enger et al. |
| 7,672,040 B2 | 3/2010 | Sohn et al. |
| 7,679,814 B2 | 3/2010 | Paolini et al. |
| 7,688,497 B2 | 3/2010 | Danner et al. |
| 7,733,335 B2 | 6/2010 | Zehner et al. |
| 7,785,988 B2 | 8/2010 | Amundson et al. |
| 7,787,169 B2 | 8/2010 | Abramson et al. |
| 7,839,564 B2 | 11/2010 | Whitesides et al. |
| 7,843,624 B2 | 11/2010 | Danner |
| 7,843,626 B2 | 11/2010 | Amundson et al. |
| 7,859,637 B2 | 12/2010 | Amundson et al. |
| 7,893,435 B2 | 2/2011 | Kazlas et al. |
| 7,898,717 B2 | 3/2011 | Patry et al. |
| 7,957,053 B2 | 6/2011 | Honeyman et al. |
| 7,986,450 B2 | 7/2011 | Cao et al. |
| 8,009,344 B2 | 8/2011 | Danner et al. |
| 8,009,348 B2 | 8/2011 | Zehner |
| 8,027,081 B2 | 9/2011 | Danner et al. |
| 8,040,594 B2 | 10/2011 | Paolini, Jr. |
| 8,049,947 B2 | 11/2011 | Danner et al. |
| 8,077,141 B2 | 12/2011 | Duthaler et al. |
| 8,089,453 B2 | 1/2012 | Comiskey et al. |
| 8,098,418 B2 | 1/2012 | Paolini, Jr. |
| 8,208,193 B2 | 6/2012 | Patry et al. |
| 8,319,759 B2 | 11/2012 | Jacobson et al. |
| 8,373,211 B2 | 2/2013 | Amundson et al. |
| 8,389,381 B2 | 3/2013 | Amundson et al. |
| 8,498,042 B2 | 7/2013 | Danner et al. |
| 8,547,628 B2 | 10/2013 | Wu |
| 8,728,266 B2 | 5/2014 | Danner et al. |
| 8,754,859 B2 | 6/2014 | Gates et al. |
| 2002/0060321 A1 | 5/2002 | Kazlas et al. |
| 2004/0105036 A1 | 6/2004 | Danner et al. |
| 2005/0122306 A1 | 6/2005 | Wilcox et al. |
| 2005/0122563 A1 | 6/2005 | Honeyman et al. |

(56) References Cited

U.S. PATENT DOCUMENTS

| | | |
|---|---|---|
| 2006/0131567 A1* | 6/2006 | Liu .................. H01L 51/0021 257/40 |
| 2007/0052757 A1 | 3/2007 | Jacobson |
| 2007/0097489 A1 | 5/2007 | Doshi et al. |
| 2007/0211002 A1 | 9/2007 | Zehner et al. |
| 2009/0004442 A1* | 1/2009 | Danner .................. B32B 37/24 428/195.1 |
| 2009/0122389 A1 | 5/2009 | Whitesides et al. |
| 2009/0315044 A1 | 12/2009 | Amundson et al. |
| 2010/0265561 A1 | 10/2010 | Gates et al. |
| 2011/0026101 A1 | 2/2011 | Wu et al. |
| 2011/0140744 A1 | 6/2011 | Kazlas et al. |
| 2011/0187683 A1 | 8/2011 | Wilcox et al. |
| 2011/0187689 A1 | 8/2011 | Bishop |
| 2011/0286082 A1 | 11/2011 | Danner et al. |
| 2011/0292319 A1 | 12/2011 | Cole |
| 2011/0292493 A1 | 12/2011 | Danner et al. |
| 2011/0292494 A1 | 12/2011 | Danner et al. |
| 2011/0304652 A1* | 12/2011 | Korthuis .................. G02F 1/167 345/690 |
| 2012/0182599 A1 | 7/2012 | Paolini, Jr. et al. |
| 2012/0293858 A1 | 11/2012 | Telfer et al. |

OTHER PUBLICATIONS

Hayes, R.A., et al., "Video-Speed Electronic Paper Based on Electrowetting", Nature, vol. 425, Sep. 25, pp. 383-385 (2003).

Kitamura, T,, et al., "Electrical toner movement for electronic paper-like display", Asia Display/IDW '01, p. 1517, Paper HCS1-1 (2001).

O'Regan, B. et al., "A Low Cost, High-efficiency Solar Cell Based on Dye-sensitized colloidal TiO2 Films", Nature, vol. 353, Oct. 24, 1991, 773-740.

Wood, D., "An Electrochromic Renaissance?" Information Display, 18(3), 24 (Mar. 2002).

Yamaguchi, Y., at al., "Toner display using insulative particles charged triboelectricaily", Asia Display/IDW '01, p. 1729, Paper AMD4-4 (2001).

Korean Intellectual Property Office; PCT/US2014/011077; International Search Report and Written Opinion; May 8, 2014. May 8, 2014.

\* cited by examiner

ELECTRODE STRUCTURES FOR ELECTRO-OPTIC DISPLAYS

REFERENCE TO RELATED APPLICATIONS

This application claims benefit of Application Ser. No. 62/022,924 filed Jul. 10, 2014. This application is also a continuation-in-part of application Ser. No. 14/152,067, filed Jan. 10, 2014 (Publication No. 2015/0015932, which itself claims benefit of Application Ser. No. 61/750,980, filed Jan. 10, 2013).

This application is also related to U.S. Pat. Nos. 6,724,519 and 7,564,614.

The entire contents of these patents and copending application, and of all other U.S. patents and published and copending applications mentioned below, are herein incorporated by reference.

BACKGROUND OF INVENTION

This invention relates to electrode structures. These electrode structures are especially intended for use in electro-optic displays but may also find use in other applications.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in U.S. Pat. No. 7,170,670 that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

The term "electro-optic", as applied to a material or a display, is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, or luminescence or, in the case of displays intended for machine reading, pseudo-color in the sense of a change in reflectance of electromagnetic wavelengths outside the visible range.

Some electro-optic media are solid in the sense that the materials have solid external surfaces, although the media may, and often do, have internal liquid- or gas-filled spaces. Displays using solid electro-optic media may hereinafter for convenience be referred to as "solid electrophoretic displays".

Several types of electro-optic displays are known. One type of electro-optic display is a rotating bichromal member type as described, for example, in U.S. Pat. Nos. 5,808,783; 5,777,782; 5,760,761; 6,054,071 6,055,091; 6,097,531; 6,128,124; 6,137,467; and 6,147,791 (although this type of display is often referred to as a "rotating bichromal ball" display, the term "rotating bichromal member" is preferred as more accurate since in some of the patents mentioned above the rotating members are not spherical). Such a display uses a large number of small bodies (typically spherical or cylindrical) which have two or more sections with differing optical characteristics, and an internal dipole. These bodies are suspended within liquid-filled vacuoles within a matrix, the vacuoles being filled with liquid so that the bodies are free to rotate. The appearance of the display is changed by applying an electric field thereto, thus rotating the bodies to various positions and varying which of the sections of the bodies is seen through a viewing surface. This type of electro-optic medium is typically bistable.

Another type of electro-optic display uses an electrochromic medium, for example an electrochromic medium in the form of a nanochromic film comprising an electrode formed at least in part from a semi-conducting metal oxide and a plurality of dye molecules capable of reversible color change attached to the electrode; see, for example O'Regan, B., et al., Nature 1991, 353, 737; and Wood, D., Information Display, 18(3), 24 (March 2002). See also Bach, U., et al., Adv. Mater., 2002, 14(11), 845. Nanochromic films of this type are also described, for example, in U.S. Pat. Nos. 6,301,038; 6,870,657; and 6,950,220. This type of medium is also typically bistable.

Another type of electro-optic display is an electro-wetting display developed by Philips and described in Hayes, R. A., et al., "Video-Speed Electronic Paper Based on Electrowetting", Nature, 425, 383-385 (2003). It is shown in U.S. Pat. No. 7,420,549 that such electro-wetting displays can be made bistable.

One type of electro-optic display, which has been the subject of intense research and development for a number of years, is the particle-based electrophoretic display, in which a plurality of charged particles move through a fluid under the influence of an electric field. Electrophoretic displays can have attributes of good brightness and contrast, wide viewing angles, state bistability, and low power consumption when compared with liquid crystal displays. Nevertheless, problems with the long-term image quality of these displays have prevented their widespread usage. For example, particles that make up electrophoretic displays tend to settle, resulting in inadequate service-life for these displays.

As noted above, electrophoretic media require the presence of a fluid. In most prior art electrophoretic media, this fluid is a liquid, but electrophoretic media can be produced using gaseous fluids; see, for example, Kitamura, T., et al., "Electrical toner movement for electronic paper-like display", IDW Japan, 2001, Paper HCS1-1, and Yamaguchi, Y., et al., "Toner display using insulative particles charged triboelectrically", IDW Japan, 2001, Paper AMD4-4). See also U.S. Pat. Nos. 7,321,459 and 7,236,291. Such gas-based electrophoretic media appear to be susceptible to the same types of problems due to particle settling as liquid-based electrophoretic media, when the media are used in an orientation which permits such settling, for example in a sign where the medium is disposed in a vertical plane. Indeed, particle settling appears to be a more serious problem in gas-based electrophoretic media than in liquid-based ones, since the lower viscosity of gaseous suspending fluids as compared with liquid ones allows more rapid settling of the electrophoretic particles.

Numerous patents and applications assigned to or in the names of the Massachusetts Institute of Technology (MIT) and E Ink Corporation describe various technologies used in encapsulated electrophoretic and other electro-optic media. Such encapsulated media comprise numerous small capsules, each of which itself comprises an internal phase containing electrophoretically-mobile particles in a fluid medium, and a capsule wall surrounding the internal phase. Typically, the capsules are themselves held within a polymeric binder to form a coherent layer positioned between two electrodes. The technologies described in the these patents and applications include:

(a) Electrophoretic particles, fluids and fluid additives; see for example U.S. Pat. Nos. 7,002,728 and 7,679,814;

(b) Capsules, binders and encapsulation processes; see for example U.S. Pat. Nos. 6,922,276 and 7,411,719;

(c) Films and sub-assemblies containing electro-optic materials; see for example U.S. Pat. Nos. 6,982,178 and 7,839,564;

(d) Backplanes, adhesive layers and other auxiliary layers and methods used in displays; see for example U.S. Pat. No. D485,294; 6,124,851; 6,130,773; 6,177,921; 6,232,950; 6,252,564; 6,312,304; 6,312,971; 6,376,828; 6,392,786; 6,413,790; 6,422,687; 6,445,374; 6,480,182; 6,498,114; 6,506,438; 6,518,949; 6,521,489; 6,535,197; 6,545,291; 6,639,578; 6,657,772; 6,664,944; 6,680,725; 6,683,333; 6,724,519; 6,750,473; 6,816,147; 6,819,471; 6,825,068; 6,831,769; 6,842,167; 6,842,279; 6,842,657; 6,865,010; 6,967,640; 6,980,196; 7,012,735; 7,030,412; 7,075,703; 7,106,296; 7,110,163; 7,116,318; 7,148,128; 7,167,155; 7,173,752; 7,176,880; 7,190,008; 7,206,119; 7,223,672; 7,230,751; 7,256,766; 7,259,744; 7,280,094; 7,327,511; 7,349,148; 7,352,353; 7,365,394; 7,365,733; 7,382,363; 7,388,572; 7,442,587; 7,492,497; 7,535,624; 7,551,346; 7,554,712; 7,583,427; 7,598,173; 7,605,799; 7,636,191; 7,649,674; 7,667,886; 7,672,040; 7,688,497; 7,733,335; 7,785,988; 7,843,626; 7,859,637; 7,893,435; 7,898,717; 7,957,053; 7,986,450; 8,009,344; 8,027,081; 8,049,947; 8,077,141; 8,089,453; 8,208,193; and 8,373,211; and U.S. Patent Application Publication Nos. 2002/0060321; 2004/0105036; 2005/0122306; 2005/0122563; 2007/0052757; 2007/0097489; 2007/0109219; 2007/0211002; 2009/0122389; 2009/0315044; 2010/0265239; 2011/0026101; 2011/0140744; 2011/0187683; 2011/0187689; 2011/0286082; 2011/0286086; 2011/0292319; 2011/0292493; 2011/0292494; 2011/0297309; 2011/0310459; and 2012/0182599; and International Application Publication No. WO 00/38000; European Patents Nos. 1,099,207 B1 and 1,145,072 B1;

(e) Color formation and color adjustment; see for example U.S. Pat. Nos. 7,075,502 and 7,839,564;

(f) Methods for driving displays; see for example U.S. Pat. Nos. 7,012,600 and 7,453,445;

(g) Applications of displays; see for example U.S. Pat. Nos. 7,312,784 and 8,009,348; and (h) Non-electrophoretic displays, as described in U.S. Pat. Nos. 6,241,921; 6,950,220; 7,420,549 and 8,319,759; and U.S. Patent Application Publication No. 2012/0293858.

Many of the aforementioned patents and applications recognize that the walls surrounding the discrete microcapsules in an encapsulated electrophoretic medium could be replaced by a continuous phase, thus producing a so-called polymer-dispersed electrophoretic display, in which the electrophoretic medium comprises a plurality of discrete droplets of an electrophoretic fluid and a continuous phase of a polymeric material, and that the discrete droplets of electrophoretic fluid within such a polymer-dispersed electrophoretic display may be regarded as capsules or microcapsules even though no discrete capsule membrane is associated with each individual droplet; see for example, the aforementioned U.S. Pat. No. 6,866,760. Accordingly, for purposes of the present application, such polymer-dispersed electrophoretic media are regarded as sub-species of encapsulated electrophoretic media.

A related type of electrophoretic display is a so-called "microcell electrophoretic display". In a microcell electrophoretic display, the charged particles and the fluid are not encapsulated within microcapsules but instead are retained within a plurality of cavities formed within a carrier medium, typically a polymeric film. See, for example, U.S. Pat. Nos. 6,672,921 and 6,788,449, both assigned to Sipix Imaging, Inc.

Although electrophoretic media are often opaque (since, for example, in many electrophoretic media, the particles substantially block transmission of visible light through the display) and operate in a reflective mode, many electrophoretic displays can be made to operate in a so-called "shutter mode" in which one display state is substantially opaque and one is light-transmissive. See, for example, U.S. Pat. Nos. 5,872,552; 6,130,774; 6,144,361; 6,172,798; 6,271,823; 6,225,971; and 6,184,856. Dielectrophoretic displays, which are similar to electrophoretic displays but rely upon variations in electric field strength, can operate in a similar mode; see U.S. Pat. No. 4,418,346. Other types of electro-optic displays may also be capable of operating in shutter mode. Electro-optic media operating in shutter mode may be useful in multi-layer structures for full color displays; in such structures, at least one layer adjacent the viewing surface of the display operates in shutter mode to expose or conceal a second layer more distant from the viewing surface.

An encapsulated electrophoretic display typically does not suffer from the clustering and settling failure mode of traditional electrophoretic devices and provides further advantages, such as the ability to print or coat the display on a wide variety of flexible and rigid substrates. (Use of the word "printing" is intended to include all forms of printing and coating, including, but without limitation: pre-metered coatings such as patch die coating, slot or extrusion coating, slide or cascade coating, curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; ink jet printing processes; electrophoretic deposition (See U.S. Pat. No. 7,339,715); and other similar techniques.) Thus, the resulting display can be flexible. Further, because the display medium can be printed (using a variety of methods), the display itself can be made inexpensively.

An electro-optic display normally comprises a layer of electro-optic material and at least two other layers disposed on opposed sides of the electro-optic material, one of these two layers being an electrode layer. In most such displays both the layers are electrode layers, and one or both of the electrode layers are patterned to define the pixels of the display. For example, one electrode layer may be patterned into elongate row electrodes and the other into elongate column electrodes running at right angles to the row electrodes, the pixels being defined by the intersections of the row and column electrodes. Alternatively, and more commonly, one electrode layer has the form of a single continuous electrode and the other electrode layer is patterned into a matrix of pixel electrodes, each of which defines one pixel of the display. In another type of electro-optic display, which is intended for use with a stylus, print head or similar movable electrode separate from the display, only one of the layers adjacent the electro-optic layer comprises an electrode, the layer on the opposed side of the electro-optic layer typically being a protective layer intended to prevent the movable electrode damaging the electro-optic layer.

The manufacture of a three-layer electro-optic display normally involves at least one lamination operation. For example, in several of the aforementioned MIT and E Ink patents and applications, there is described a process for manufacturing an encapsulated electrophoretic display in which an encapsulated electrophoretic medium comprising capsules in a binder is coated on to a flexible substrate comprising indium-tin-oxide (ITO) or a similar conductive coating (which acts as one electrode of the final display) on a plastic film, the capsules/binder coating being dried to form a coherent layer of the electrophoretic medium firmly adhered to the substrate. Separately, a backplane, containing an array of pixel electrodes and an appropriate arrangement of conductors to connect the pixel electrodes to drive circuitry, is prepared. To form the final display, the substrate having the capsule/binder layer thereon is laminated to the backplane using a lamination adhesive. (A very similar process can be used to prepare an electrophoretic display usable with a stylus or similar movable electrode by replacing the backplane with a simple protective layer, such as a plastic film, over which the stylus or other movable electrode can slide.) In one preferred form of such a process, the backplane is itself flexible and is prepared by printing the pixel electrodes and conductors on a plastic film or other flexible substrate. The obvious lamination technique for mass production of displays by this process is roll lamination using a lamination adhesive. Similar manufacturing techniques can be used with other types of electro-optic displays. For example, a microcell electrophoretic medium or a rotating bichromal member medium may be laminated to a backplane in substantially the same manner as an encapsulated electrophoretic medium.

As discussed in the aforementioned U.S. Pat. No. 6,982,178, (see column 3, lines 63 to column 5, line 46) many of the components used in solid electro-optic displays, and the methods used to manufacture such displays, are derived from technology used in liquid crystal displays (LCD's), which are of course also electro-optic displays, though using a liquid rather than a solid medium. For example, solid electro-optic displays may make use of an active matrix backplane comprising an array of transistors or diodes and a corresponding array of pixel electrodes, and a "continuous" front electrode (in the sense of an electrode which extends over multiple pixels and typically the whole display) on a transparent substrate, these components being essentially the same as in LCD's. However, the methods used for assembling LCD's cannot be used with solid electro-optic displays. LCD's are normally assembled by forming the backplane and front electrode on separate glass substrates, then adhesively securing these components together leaving a small aperture between them, placing the resultant assembly under vacuum, and immersing the assembly in a bath of the liquid crystal, so that the liquid crystal flows through the aperture between the backplane and the front electrode. Finally, with the liquid crystal in place, the aperture is sealed to provide the final display.

This LCD assembly process cannot readily be transferred to solid electro-optic displays. Because the electro-optic material is solid, it must be present between the backplane and the front electrode before these two integers are secured to each other. Furthermore, in contrast to a liquid crystal material, which is simply placed between the front electrode and the backplane without being attached to either, a solid electro-optic medium normally needs to be secured to both; in most cases the solid electro-optic medium is formed on the front electrode, since this is generally easier than forming the medium on the circuitry-containing backplane, and the front electrode/electro-optic medium combination is then laminated to the backplane, typically by covering the entire surface of the electro-optic medium with an adhesive and laminating under heat, pressure and possibly vacuum. Accordingly, most prior art methods for final lamination of solid electrophoretic displays are essentially batch methods in which (typically) the electro-optic medium, a lamination adhesive and a backplane are brought together immediately prior to final assembly, and it is desirable to provide methods better adapted for mass production.

The aforementioned U.S. Pat. No. 6,982,178 describes a method of assembling a solid electro-optic display (including an encapsulated electrophoretic display) which is well adapted for mass production. Essentially, this patent describes a so-called "front plane laminate" ("FPL") which comprises, in order, a light-transmissive electrically-conductive layer; a layer of a solid electro-optic medium in electrical contact with the electrically-conductive layer; an adhesive layer; and a release sheet. Typically, the light-transmissive electrically-conductive layer will be carried on a light-transmissive substrate, which is preferably flexible, in the sense that the substrate can be manually wrapped around a drum (say) 10 inches (254 mm) in diameter without permanent deformation. The term "light-transmissive" is used in this patent and herein to mean that the layer thus designated transmits sufficient light to enable an observer, looking through that layer, to observe the change in display states of the electro-optic medium, which will normally be viewed through the electrically-conductive layer and adjacent substrate (if present); in cases where the electro-optic medium displays a change in reflectivity at non-visible wavelengths, the term "light-transmissive" should of course be interpreted to refer to transmission of the relevant non-visible wavelengths. The substrate will typically be a polymeric film, and will normally have a thickness in the range of about 1 to about 25 mil (25 to 634 µm), preferably about 2 to about 10 mil (51 to 254 µm). The electrically-conductive layer is conveniently a thin metal or metal oxide layer of, for example, aluminum or ITO, or may be a conductive polymer. Poly(ethylene terephthalate) (PET) films coated with aluminum or ITO are available commercially, for example as "aluminized Mylar" ("Mylar" is a Registered Trade Mark) from E.I. du Pont de Nemours & Company, Wilmington Del., and such commercial materials may be used with good results in the front plane laminate.

Assembly of an electro-optic display using such a front plane laminate may be effected by removing the release sheet from the front plane laminate and contacting the adhesive layer with the backplane under conditions effective to cause the adhesive layer to adhere to the backplane, thereby securing the adhesive layer, layer of electro-optic medium and electrically-conductive layer to the backplane. This process is well-adapted to mass production since the front plane laminate may be mass produced, typically using roll-to-roll coating techniques, and then cut into pieces of any size needed for use with specific backplanes.

U.S. Pat. No. 7,561,324 describes a so-called "double release sheet" which is essentially a simplified version of the front plane laminate of the aforementioned U.S. Pat. No. 6,982,178. One form of the double release sheet comprises a layer of a solid electro-optic medium sandwiched between two adhesive layers, one or both of the adhesive layers being covered by a release sheet. Another form of the double release sheet comprises a layer of a solid electro-optic medium sandwiched between two release sheets. Both forms of the double release film are intended for use in a process generally similar to the process for assembling an electro-optic display from a front plane laminate already described, but involving two separate laminations; typically, in a first lamination the double release sheet is laminated to a front electrode to form a front sub-assembly, and then in a second lamination the front sub-assembly is laminated to a backplane to form the final display, although the order of these two laminations could be reversed if desired.

U.S. Pat. No. 7,839,564 describes a so-called "inverted front plane laminate", which is a variant of the front plane laminate described in the aforementioned U.S. Pat. No. 6,982,178. This inverted front plane laminate comprises, in order, at least one of a light-transmissive protective layer and a light-transmissive electrically-conductive layer; an adhesive layer; a layer of a solid electro-optic medium; and a release sheet. This inverted front plane laminate is used to form an electro-optic display having a layer of lamination adhesive between the electro-optic layer and the front electrode or front substrate; a second, typically thin, layer of adhesive may or may not be present between the electro-optic layer and a backplane. Such electro-optic displays can combine good resolution with good low temperature performance.

In a high-resolution display, each individual pixel must be addressable without interference from the addressing of adjacent pixels (whether or not the electro-optic medium used is bistable). One way to achieve this objective is to provide an array of non-linear elements, such as transistors or diodes, wherein at least one non-linear element is associated with each pixel, to produce an active matrix display, as mentioned above. An addressing (pixel) electrode, which addresses one pixel, is connected to an appropriate voltage source through its associated non-linear element. Conventionally, in high resolution arrays, the pixels are arranged in a two-dimensional array of rows and columns, such that any specific pixel is uniquely defined by the intersection of one specified row and one specified column. The sources of all the transistors in each column are connected to a single column electrode, while the gates of all the transistors in each row are connected to a single row electrode; the assignment of sources to rows and gates to columns is conventional and could be reversed if desired. The row electrodes are connected to a row driver, which essentially ensures that at any given moment only one row is selected, i.e., that there is applied to the selected row electrode a voltage such as to ensure that all the transistors in the selected row are conductive, while there is applied to all other rows a voltage such as to ensure that all the transistors in these non-selected rows remain non-conductive. The column electrodes are connected to column drivers, which place upon the various column electrodes voltages selected to drive the pixels in the selected row to their desired optical states. (The aforementioned voltages are relative to a common front electrode which is conventionally provided on the opposed side of the electro-optic medium from the non-linear array and extends across the whole display.) After a pre-selected interval known as the "line address time" the selected row is deselected, the next row is selected, and the voltages on the column drivers are changed so that the next line of the display is written. This process is repeated so that the entire display is written in a row-by-row manner.

In the discussion below, the term "waveform" will be used to denote the entire voltage against time curve used to effect the transition of a pixel from one specific initial gray level to a specific final gray level. Typically such a waveform will comprise a plurality of waveform elements; where these elements are essentially rectangular (i.e., where a given element comprises application of a constant voltage for a period of time); the elements may be called "pulses" or "drive pulses". The term "drive scheme" denotes a set of waveforms sufficient to effect all possible transitions between gray levels for a specific display. A display may make use of more than one drive scheme; for example, U.S. Pat. No. 7,012,600 teaches that a drive scheme may need to be modified depending upon parameters such as the temperature of the display or the time for which it has been in operation during its lifetime, and thus a display may be provided with a plurality of different drive schemes to be used at differing temperature etc. A set of drive schemes used in this manner may be referred to as "a set of related drive schemes."

Prior art front electrodes for use with the electrophoretic and similar electro-optic displays typically comprise a very thin (about 0.1 μm) layer of a ceramic, such as indium tin oxide or a similar mixed metal oxide (see the aforementioned U.S. Pat. No. 6,982,178). This thin layer is normally formed by sputtering the ceramic on to a polymer film, typically poly(ethylene terephthalate). Prior art rear (pixel) electrodes may be formed in a similar manner, or may be formed from thin metal films; the front electrode must of course be light-transmissive to enable the electro-optic layer to be seen, whereas with a reflective electro-optic layer, the rear electrodes can be opaque.

Although ceramic front electrodes have been in large scale commercial use for a many years, they still suffer from a number of mechanical, optical and electrical problems. Ceramics are inherently brittle, and the tensions and temperatures used during lamination steps in the manufacture of the display may cause the ceramic to crack and form discontinuities in conductivity, leading to poor or inconsistent switching of the display. These cracks are also areas of high water vapor transmission, which may cause local damage to a humidity-sensitive electro-optic medium (many of the aforementioned types of electro-optic media are sensitive to humidity). In color display using color filter arrays (CFA's), it is desirable to reduce parallax problems by bringing the CFA as close as possible to the electro-optic layer using a thin polymeric film. As the polymeric film substrate is made thinner the cracking issues are exacerbated due to the higher thermal shrinkage of the thin film.

Furthermore, ceramic electrodes normally have substantially higher indices of refraction than the polymeric films on which the electrodes are deposited. For example, ITO has a refractive index at 500 nm of 1.95, whereas PET has a refractive index of only 1.65 at the same wavelength. This results in large Fresnel losses at the ceramic electrode/polymeric film interface, thus reducing the amount of light reaching the electro-optic layer. Also, many ceramic electrodes tend introduce slight color distortions; for example, ITO has higher absorption at the blue end of the visible spectrum and thus tends to impart to black-and-white displays a visually-displeasing yellow tint.

Furthermore, as discussed in detail in the aforementioned U.S. Pat. No. 7,119,772, it has been found desirable for at least some types of electro-optic display that the drive scheme at each pixel location be DC balanced, in the sense that, for any series of transitions beginning and ending at the same gray level, the algebraic sum of the impulses applied during the series of transitions be bounded. It has been found that accurately DC-balanced waveforms (i.e., those in which the integral of current against time for any particular pixel of the display is held to zero over an extended period of operation of the display) are required to preserve image stability, maintain symmetrical switching characteristics, and provide the maximum useful working lifetime in certain displays of the prior art. Waveforms which are not DC-balanced may result in polarization kickback (a change in the optical state of an electro-optic medium in a short period after the medium ceases to be driven; for example, a pixel driven to black may revert to a dark gray in a short period after the waveform concludes) and damage to the electrodes. These effects may occur at either the interface between the front electrode and an adjacent lamination adhesive layer or at the interface between a rear electrode and an adjacent lamination adhesive layer, and are primarily governed by the electrochemical properties of the materials forming the electrode and the lamination adhesive; rear electrodes may for example be formed from ITO or nickel-boron (NiB).

It is in general preferred that all individual waveforms within a drive scheme be DC balanced, but in practice this has been difficult to achieve, so typical drive schemes have usually been a mixture of DC balanced and DC imbalanced waveforms, even though the drive scheme as a whole has been DC balanced.

As discussed in the aforementioned U.S. Pat. No. 7,119,772, the extent to which DC-imbalanced driving affects an electrophoretic or other electro-optic display (presumably by polarization of certain display components, as discussed in more detail below) may be ascertained by measuring the open-circuit potential (hereinafter for convenience called the "remnant voltage") of a particular region (say, a pixel) of the display. When the remnant voltage of a pixel is zero, it is taken to be DC balanced. If its remnant voltage is positive, it is taken to be DC unbalanced in the positive direction. If its remnant voltage is negative, it is taken to be DC unbalanced in the negative direction. Non-zero remnant voltages have been found to correlate with difficulties in accurate gray level placement.

The degradation in display performance caused by development of remnant voltage is generally reversible, either by storing the display without further switching or by switching appropriately to rebalance the DC impulses. In cases where a prior art electrophoretic display is driven with extreme degrees of DC-imbalance, however, it is possible that the electrodes may be irreversibly degraded, presumably by electrochemical reactions that consume the electrode materials.

Although DC-balanced driving waveforms effectively protect against development of remnant voltages and electrode degradation there are problems associated with their use. Extra time must be allocated in order to provide balancing impulses, sometimes resulting in update times that are two to three times longer than would be possible with a DC-imbalanced drive. In some electrophoretic compositions the time required for an optical transition from black to white is different from that required from white to black. In a DC-balanced waveform the longer of the two switching times must be used for both transitions. In addition, distracting optical transitions may be visible to the user of the display during DC-balanced updates.

Efforts have been made to reduce or eliminate the aforementioned problems in order to permit the use of non-DC-balanced drive schemes in electro-optic displays. As described for example in U.S. Pat. Nos. 6,724,519 and 7,564,614, corrosion inhibitors may be incorporated into electro-optic displays to prevent damage to electrodes from DC imbalances during driving of the displays. The aforementioned Application Ser. No. 14/152,067 teaches an electro-optic display comprising at least 10 micromoles per square meter of the viewing surface of at least one compound having an oxidation potential more negative that about 150 mV with respect to a standard hydrogen electrode, as measured at pH 8. The addition of such redox materials has been shown to help prevent yellowing of ITO and the accumulation of potential differences believed to be responsible for polarization kickback.

Conduction within a ceramic electrode occurs via electron transfer whereas conduction within a lamination adhesive occurs via ion transfer. It is believed (although the invention is in no way limited by this belief) that redox couples introduce a pathway for electron transfer between the electrode and lamination adhesive, thus increasing faradic current through the double layers at the electrode/adhesive interface, and discharging the electrical double layer and lowering polarization kickback. The redox molecule typically consists of an oxidizing agent with reduction potential lower than the ceramic and this molecule is reduced preferentially instead of the ceramic, hence preventing or delaying coloration due to oxidation of the ceramic.

The present invention relates to multi-layer electrode structures which can reduce or eliminate at least some of the aforementioned problems associated with the use of ceramic electrodes in electro-optic displays.

SUMMARY OF INVENTION

Accordingly, in one aspect this invention provides a sub-assembly for use in an electro-optic display, the sub-assembly comprising in order:
  an electrically non-conductive substrate;
  a light-transmissive electrically-conductive ceramic layer; and
  a light-transmissive non-ceramic electrically-conductive layer comprising a material selected from the group consisting of conductive organic polymers and solution-processable conductors.

In this sub-assembly, the substrate will usually be light-transmissive, although a non-light-transmissive substrate may be used where the first sub-assembly forms part of the backplane, as described below. The conductive organic polymer used may be, for example, a polythiophene or polyaniline, a specific preferred type of polymer being poly(3,4-ethylenedioxy)thiophene polystyrene sulfonate (PEDOT:PSS), of the formula:

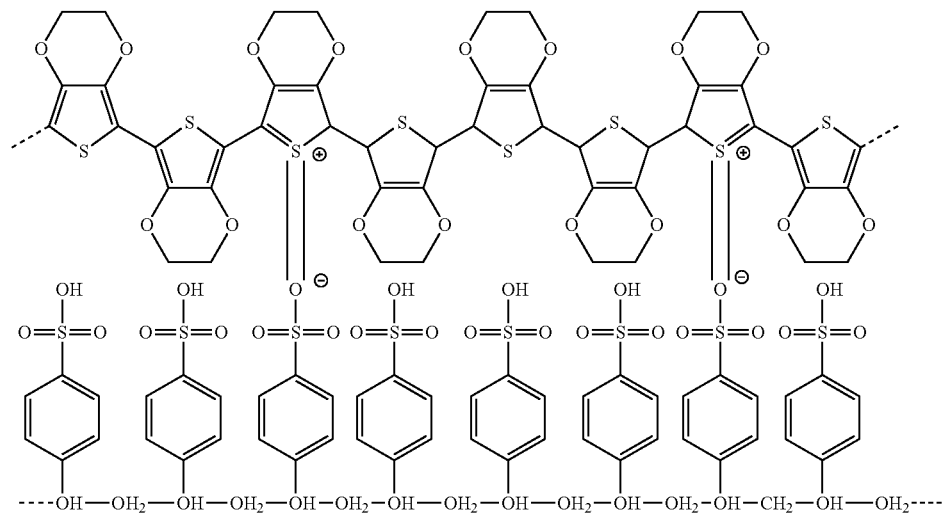

The solution-processable conductor may be carbon nanotubes or silver nanowires, or similar materials having a plurality of nanoscale conductors. The ceramic layer may be formed from any of the ceramics known to be useful as electrodes, for example ITO, halogenated ITO, indium zinc oxide (IZO) or indium zirconium oxide.

The sub-assemblies of the present invention may of course comprise additional layers or modifications of existing layers. In particular, the sub-assemblies of the present invention may comprise color filter arrays (CFA's) formed at any location within, or on the surfaces of the sub-assemblies. Thus, for example, a CFA may be provided on the surface of the substrate remote from the ceramic layer or conductive organic polymer, within the substrate itself, or within the lamination adhesive layer; see U.S. Pat. No. 7,839,564 for methods of forming color filters within lamination adhesive layers.

This invention extends to front plane laminates, inverted front plane laminates and electro-optic displays incorporating a sub-assembly of the present invention. Such electro-optic displays may use any of the types of electro-optic media discussed above, and are especially, but not exclusively, intended for use with electrophoretic media.

The displays of the present invention may be used in any application in which prior art electro-optic displays have been used. Thus, for example, the present displays may be used in electronic book readers, portable computers, tablet computers, cellular telephones, smart cards, signs, watches, shelf labels, variable transmission windows and flash drives.

DETAILED DESCRIPTION

As already noted, the present invention provides sub-assemblies useful in electro-optic displays, especially bistable electro-optic displays.

Figure 1:
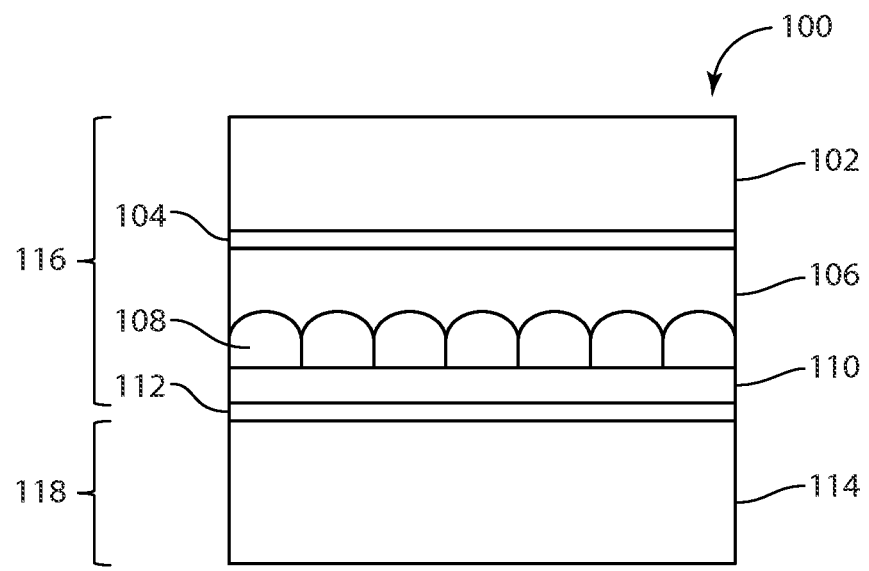
FIG. 1 of the accompanying drawings shows a schematic cross-section through an encapsulated electrophoretic display.

FIG. 1 shows a schematic cross-section through an encapsulated electrophoretic display 100, which may as described in, for example, the aforementioned U.S. Pat. No. 6,982,178. The display 100 comprises a light-transmissive substrate 102 that conveniently has the form of a transparent plastic film, such as a sheet of poly(ethylene terephthalate) (PET) between 25 and 200 μm in thickness. Although not shown in FIG. 1, the substrate 102 (the upper surface of which, as illustrated in FIG. 1, forms the viewing surface of the display) may comprise one or more additional layers, for example a protective layer to absorb ultra-violet radiation, barrier layers to prevent ingress of oxygen or moisture into the display, and anti-reflection coatings to improve the optical properties of the display.

The substrate 102 carries a front electrode 104 which may have two sub-layers. Layer 104 may comprise a continuous coating of electrically-conductive material with minimal intrinsic absorption of electromagnetic radiation in the visible spectral range such as indium tin oxide (ITO), poly(3,4-ethylenedioxythiophene) poly(styrenesulfonate) (PEDOT:PSS), graphene or the like, or may incorporate a discontinuous layer of a material such as silver (in the form of, for example, nanowires or printed grids) or carbon (for example in nanotube form) that absorb or reflect visible light but are present at a surface coverage such that the layer as a whole is effectively transparent.

A layer (generally designated 108) of an electro-optic medium is in electrical contact with the electrode 104 via a polymeric layer or layers 106 (which may be omitted). The electro-optic layer 108 is preferably an opposite charge, dual particle encapsulated electrophoretic medium of the type described in U.S. Pat. No. 6,822,782, and may comprise a plurality of microcapsules, each of which may comprise a capsule wall containing a hydrocarbon-based liquid in which are suspended negatively charged white particles and positively charged black particles. The microcapsules may be retained within a polymeric binder. Upon application of an electrical field across the layer 108, the white particles move towards the positive electrode and the black particles move towards the negative electrode, so that the layer 108 appears, to an observer viewing the display through the substrate 102, white or black depending upon whether the layer 104 is positive or negative relative to the backplane electrode 112.

Alternatively, layer 108 may be fully encapsulated or comprise sealed micro-cells or micro-cups, or may be non-encapsulated. Layer 108 may comprise particles that move through a liquid solvent or a gas, or particles that rotate within a solvent or a gas, or may modulate light by displacement of a solvent, for example by electro-wetting.

As described for example in U.S. Pat. No. 6,982,178, the display 100 further comprises a layer 110 of lamination adhesive coated over the electro-optic layer 108. The lamination adhesive makes possible the construction of an electro-optic display by combining two subassemblies, namely a backplane 118 that comprises an array of pixel electrodes 112, disposed on a substrate 114, and an appropriate arrangement of conductors to connect the pixel electrodes to drive circuitry, and a front plane 116 that comprises the substrate 102 bearing the transparent electrode 104, the electro-optic material 108, the lamination adhesive 110 and optional additional components such as polymeric layer or layers 106. To form the final display, the front plane 116 is laminated to the backplane 118 using lamination adhesive 110

In view of the known problems with simple ceramic front electrodes in electro-optic displays, as discussed above, it has previously been proposed to replace the ceramic with a conductive organic polymer, such as PEDOT:PSS. It might also appear that index-matched ceramic electrodes would be useful.

Conductive polymers such as PEDOT:PSS can withstand higher tension than ceramics during lamination without cracking They also have higher transmittance in the visible range especially the blue wavelengths, and are comparable to conventional polymeric substrates and lamination adhesives; hence, they have lower Fresnel losses allowing more light to enter the display. However, the major disadvantage of conductive polymer electrodes is their lower adhesion to conventional substrates such as PET.

As discussed in the aforementioned U.S. Pat. No. 6,982,178, in order to make electrical contact with the front electrode, it is necessary to provide, in each electro-optic display, an area of the front electrode (typically denoted a "tab") which is free from electro-optic material and adhesive. In mass production of electro-optic displays, it is in practice most convenient and economic to form layers of electro-optic material and lamination adhesive over the whole front electrode and then to remove the electro-optic material and adhesive from the tab, a process conventionally known as "top plane cleaning". However, it has been found empirically that when top plane cleaning is attempted with a conductive polymer front electrode, the electrode easily becomes damaged and is locally removed. Without a continuous polymer electrode coating, an electrical connection to the front electrode cannot be effectively made. Introducing cross-linking agents into the conductive polymer improves its adhesion to the substrate but typically causes chemical interactions between the conductive polymer and the adjacent adhesive layers. These chemical interactions cause the adhesive to bind to the conductive polymer electrode so that the adhesive cannot be cleaned off the conductive polymer and electrical contact with the front electrode cannot be made.

Index matched ceramic layers (typically formed of ITO) consist of one or more layers of index matched coating between the substrate and the ceramic layer resulting in lower Fresnel losses and higher light transmission through the front electrode. However, the problems of cracking and yellowing experienced with ITO and similar ceramics still remain.

The present inventors have found that the higher measured light transmission of conductive polymer electrode structures, as compared with ceramic electrodes, does not translate into better optical performance of a display using a reflective electro-optic medium. In such reflective displays, the ceramic ITO gave equivalent or better performance than conductive polymer or index-matched ITO electrodes. Thus, two key issues need to be addressed in order to make conductive polymer electrodes a viable alternative to ceramic electrodes, namely improving the robustness of the former in top plane cleaning and proving optical benefit (measured as white state L*) in reflective displays. The sub-assembly of the present invention provides advantages in both areas.

Figure 2:
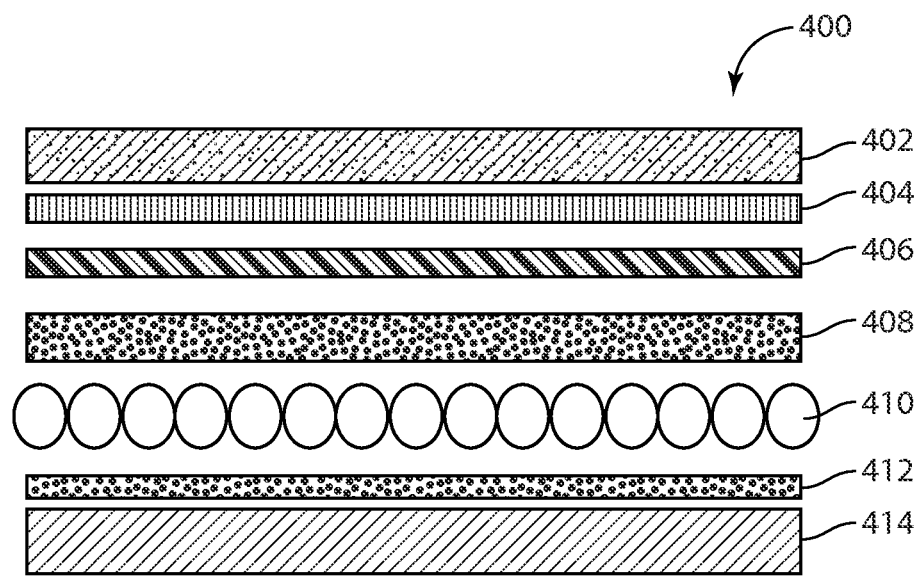
FIG. 2 is a schematic cross-section through a electro-optic display incorporating a first sub-assembly of the present invention.

FIG. 2 is a schematic exploded cross-section through a electro-optic display (generally designated 400) incorporating a sub-assembly of the present invention. The display comprises a front substrate 402, which may be formed of PET, a ceramic (ITO) high refractive index layer 404, a layer 406 of a low index conductive polymer (preferably PEDOT:PSS), a lamination adhesive layer 408, an electro-optic layer 410 (illustrated as an encapsulated electrophoretic layer), a lamination adhesive layer 412 and a backplane 414.

The high refractive index ceramic layer 404 serves two purposes, namely to create an index mismatch to channel more light out of the display, and to allow a good electrical connection to be made to the front electrode; by introducing an inorganic electrode layer underneath (i.e., on the viewing surface side of) the organic polymer layer 406; the polymer layer 406 can be sacrificially removed during top plane cleaning while still maintaining connectivity. The organic conductive layer 406 serves to reduce the thickness of the inorganic layer 404 without compromising electrical conductivity; the organic conductive layer bridges the gaps and discontinuities in the underlying thinner inorganic layer making for a continuous conducting film. The thinner ITO layer also has other advantages, namely higher transmission/ lower absorption allowing more light to reach the electro-optic layer, and lower built-in stresses and a tendency to be more amorphous and less brittle, so that less cracking should occur during lamination.

In addition to the mechanical and optical advantages already described, the sub-assembly of the present invention, and displays such as that illustrated in FIG. 2, have electrical and performance advantages, especially in enabling the use of non-DC-balanced drive schemes. The organic conductive layer acts as a redox layer and functions similarly to the redox material described in the aforementioned Application Ser. No. 14/152,067. Preliminary testing has shown that an ITO/PEDOT:PSS electrode significantly reduces polarization kickback as compared with a simple ITO electrode; the kickback performance of the compound electrode is similar to that obtained by including a redox couple in the lamination adhesive adjacent a simple ITO electrode, as described in the aforementioned Application Ser. No. 14/152,067. However, since the compound electrode in effect provides a redox couple adhered to the front electrode, there is minimal interaction between the redox couple and components of the lamination adhesive and/or electro-optic layer, and hence little risk of discoloration of the lamination adhesive or interaction with a cross-linker or dopant in the adhesive. This reduces the risk of changes in the lamination adhesive during storage and hence tends to improve the shelf life of front plane laminates or other sub-assemblies prior to incorporation in displays. It can be expected that an ITO/PEDOT:PSS electrode will help prevent or delay ITO yellowing in the same manner as a redox coating on a simple ITO electrode. Also, the development of a blue coloration observed on simple PEDOT-only electrodes due to the reduction of PEDOT, will not occur in ITO/PEDOT:PSS electrodes due to the difference in the thickness of the PEDOT layer used (of the order of 100 nm vs 10 nm).

The preferred PEDOT:PSS conductive polymer is a p-doped polymer than can readily be coated from an aqueous dispersion and has several characteristics that are advantageous in the bilayer electrode structures used in the sub-assemblies of the present invention. It has been found to be compatible with commercial electrophoretic media and associated lamination adhesives during optical and reliability testing, and no shelf life issues have been found. The material is readily available commercially. As previously noted, it can readily be coated from an aqueous dispersion, including coating on to commercial sputtered ITO layers on polymeric substrates. When so coated, PEDOT:PSS has been found to enhance the properties of the ITO layer by reducing its roughness and modifying its work function. Initial experiments using a redox couple in a lamination adhesive in contact with a simple ITO electrode suggest that the degree and speed of ITO yellowing may vary with the production lot of ITO, possibly due to the varying surface properties and/or roughness of the ITO. PEDOT:PSS coated ITO could potentially reduce this variability and help control surface properties including roughness. Work function of the electrode at the adhesive/electrode interface may be a critical property in polarization kickback and yellowing, and this work function can be tuned when ITO is coated with PEDOT:PSS. Unlike the reduction of a simple ITO electrode, PEDOT:PSS reduction is reversible without any permanent degradation. PEDOT:PSS layers can reversibly switch between reduced and oxidized states.

EXAMPLE

The following Example is given, though by way of illustration only, to show details of the advantages of the preferred ITO/PEDOT:PSS front electrodes used in the present invention, as compared with simple ITO and PEDOT:PSS single-layer electrodes.

Figure 3A:
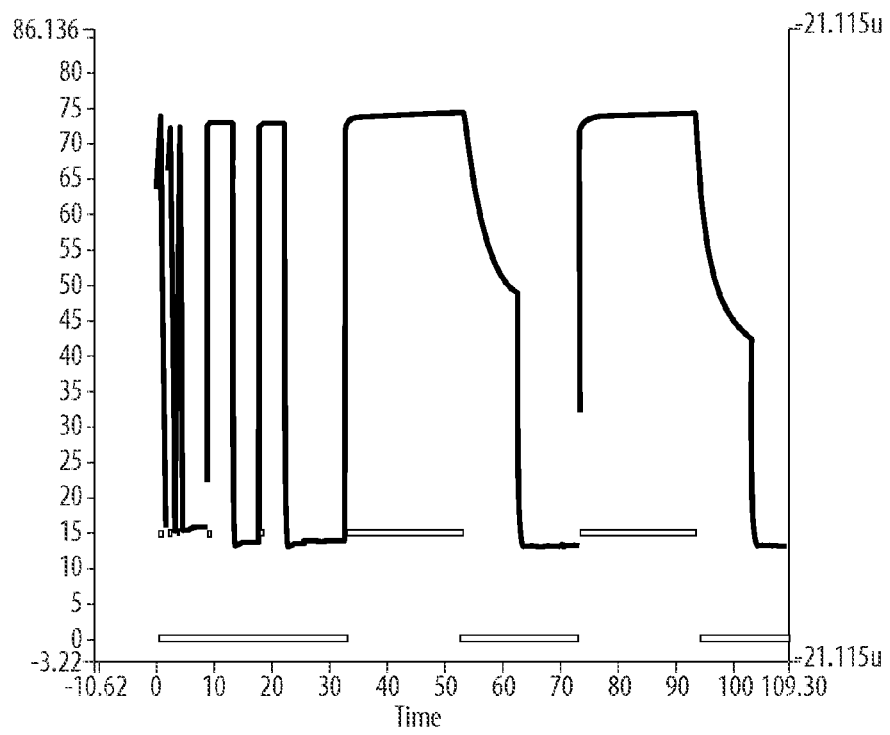
FIGS. 3A-3F are graphs of reflectivity against time obtained in the experiments described in the worked Example below for driving to white and black states experimental electro-optic displays having (i) a simple ITO electrode (FIGS. 3A/3B); (ii) a simple PEDOT electrode (FIGS. 3C/3D); and (iii) a compound ITO/PEDOT electrode (FIGS. 3E/3F).
Figure 3B:
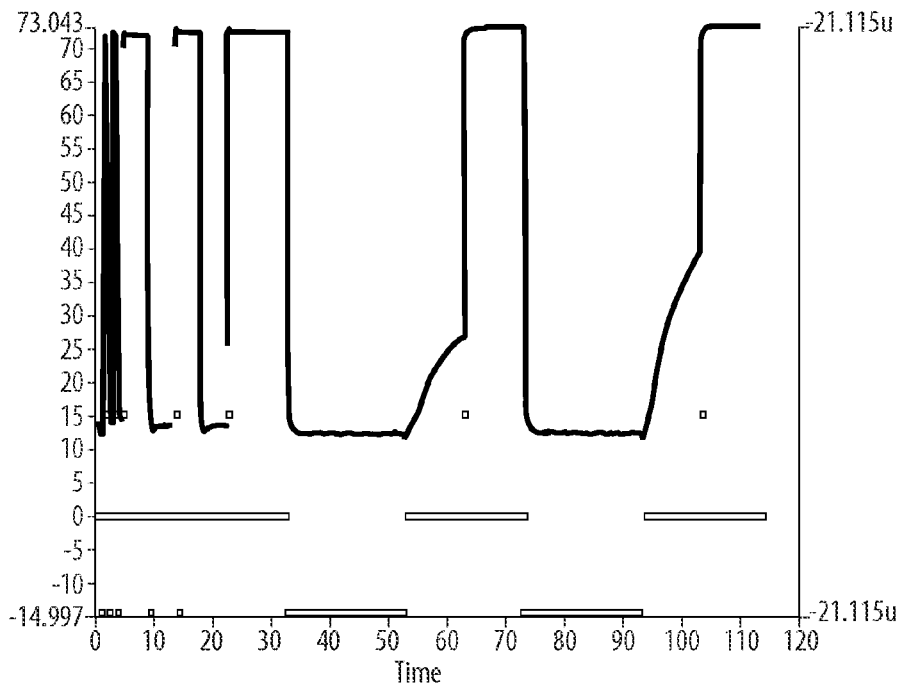
Figure 3C:
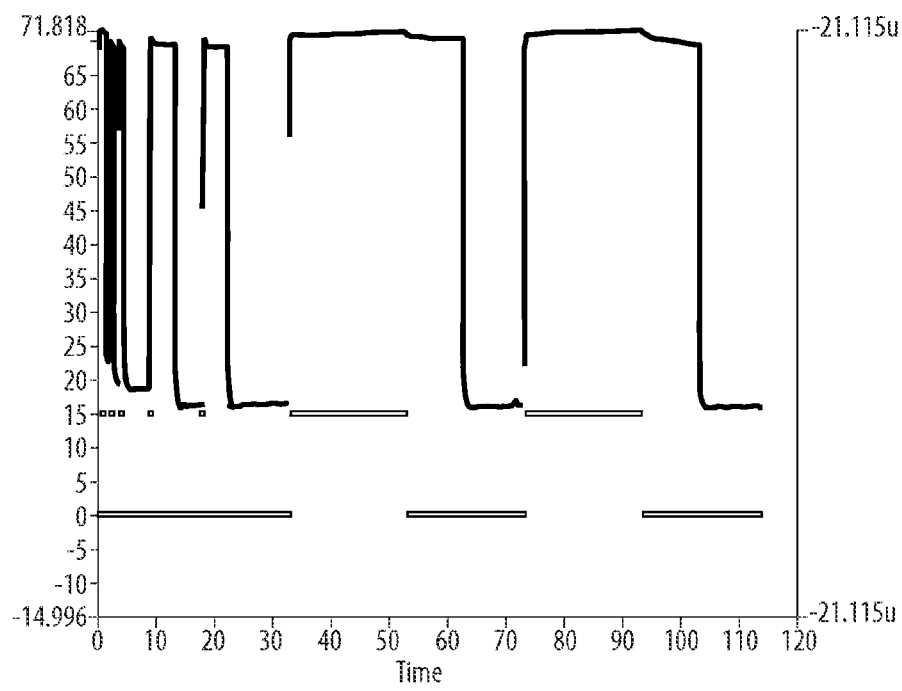
Figure 3D:
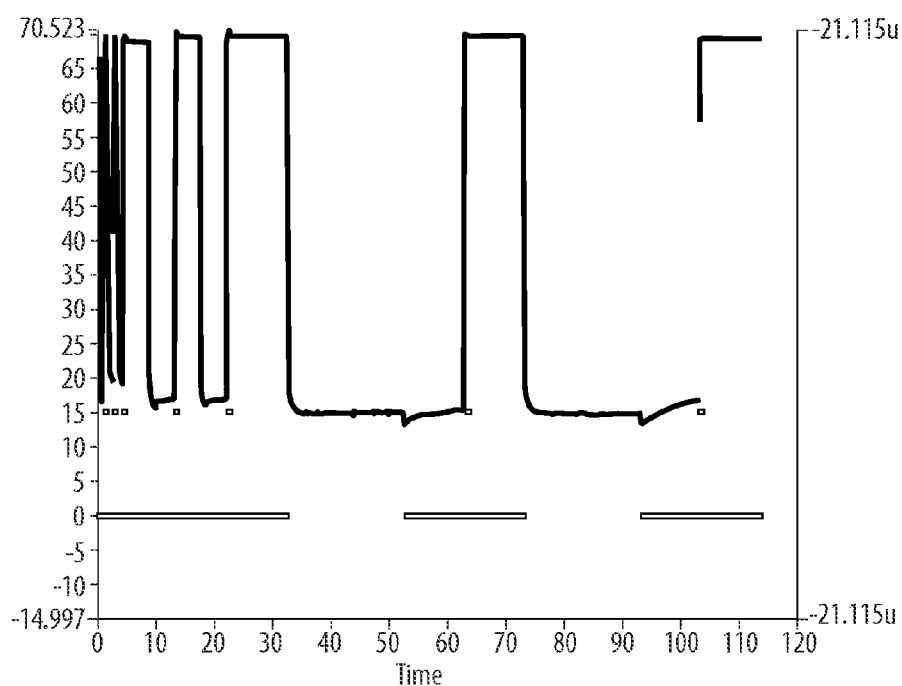
Figure 3E:
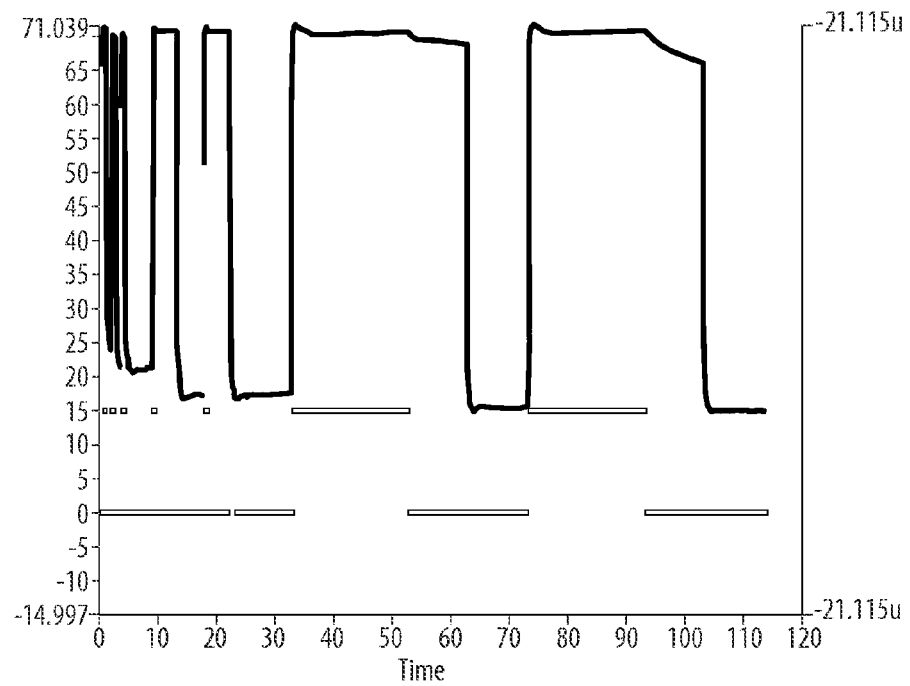
Figure 3F:
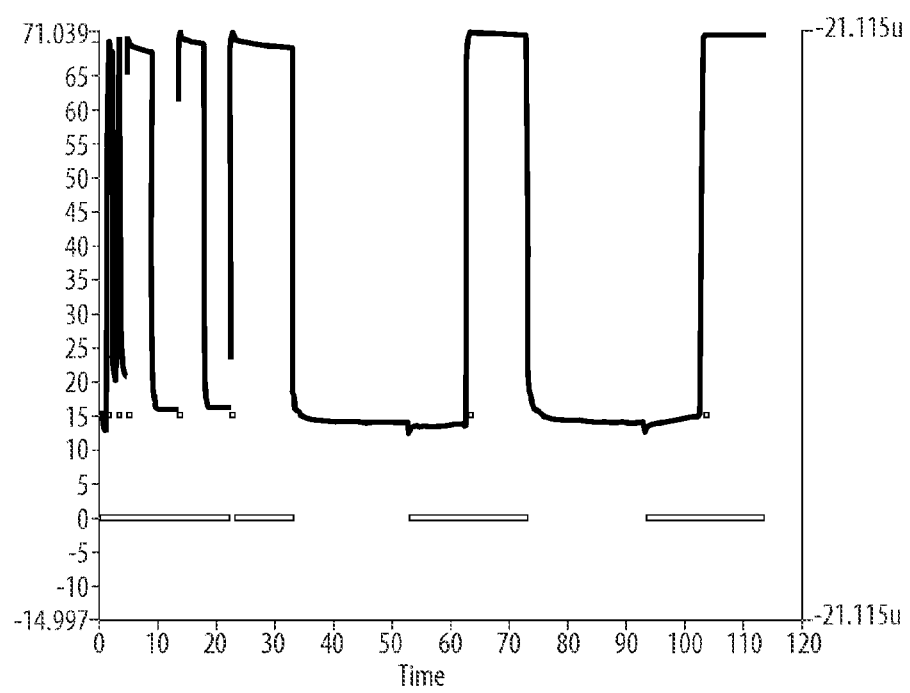

Experimental single pixel displays were prepared in essentially the same manner as in Example 1 of the aforementioned Application Ser. No. 14/152,067 except that the displays used simple ITO and PEDOT:PSS electrodes, and a ITO/PEDOT:PSS front electrode and no redox material was included in the lamination adhesive. The displays were then driven to their extreme white and black optical states using 15 V, 20 second pulses (these pulses being much longer than the period required to achieve the extreme black and white states), while the optical state of the display was continuously monitored. The white and black results for a simple ITO electrode are shown in FIGS. 3A and 3B, for a simple PEDOT electrode in FIGS. 3C and 3D, and for the compound electrode in FIGS. 3E and 3F.

From FIGS. 3A-3F, it will be seen that the simple ITO electrode had very large kickback (about 20 L*), the simple PEDOT electrode has a much lower kickback (about 3 L*) and the compound electrode has a kickback slightly higher than the simple PEDOT electrode (about 5 L*).

The reasons for these differences in kickback are not entirely understood at present. However, the following differences between PEDOT/lamination adhesive and ITO/lamination adhesive interfaces appear relevant. The work function of a PEDOT:PSS layer is different from that of ITO. In OLED applications PEDOT:PSS coatings have been used on ITO to lower work function and hence enable easier hole transport into the light emitting layer. PEDOT could potentially enable easier transport of electrons to and from the interfacial double layer to help discharge electrical charges. Also, PEDOT:PSS enables ionic exchanges with the lamination adhesive. It is known from the literature that cationic transfer of ions into a PEDOT:PSS layer occurs during reduction of PEDOT and these cations compensate for the negative charge created on PSS by forming associative bonds. The double layer so formed by a PEDOT:PSS structure may be a more leaky capacitor than the ITO double layer, so the corresponding polarization voltage would be lower, resulting in lower polarization kickback. Finally, in the absence of redox molecules at the electrode/adhesive interface, protons are intermediaries for electron transfer between electrode and adhesive. The PSS counter ion in PEDOT:PSS includes several protons, and a PEDOT:PSS layer is more hygroscopic, and thus has more moisture present, than an ITO layer. Both these effects may lead to higher levels of protons and hence lower kickback.

Furthermore, with simple PEDOT electrodes, it has been shown that polarization kickback can be reduced by addition of redox materials to the lamination adhesive; kickback as low as 2 L* has been obtained using a simple PEDOT electrode with phenidone or phenidone plus duroquinone in the adhesive and a 30 second kickback test, which represents imbalanced driving of the display (see the aforementioned Application Ser. No. 14/152,067). Although this result was obtained with a simple PEDOT electrode, for the reasons given above a similar improvement should be seen with the ITO/PEDOT electrodes used in the present invention.

"Bluing" of (development of blue color in) PEDOT:PSS layers (and similar color changes in other conductive polymers is also of concern in the present invention. In the oxidized or doped state PEDOT:PSS is transparent and conductive and when biased positively it remains transparent and conductive. However, biasing PEDOT:PSS negatively de-dopes it, and this reduces its conductivity and turns it opaque blue in color. In experimental displays having simple PEDOT front electrodes, it has been observed that pixels imbalanced negatively in the front electrode direction turn blue and eventually stop switching, but this occurs only when certain levels of imbalance are exceeded and the panels are run at high duty cycles. Thin layers of PEDOT:PSS in compound ITO/PEDOT front electrodes will also be reduced by imbalanced driving, but it is possible that thickness differences (typically 100 nm vs 10 nm) of the PEDOT coating may minimize the effect on optical performance. In a compound ITO/PEDOT front electrode, the ITO should not be reduced since it will be protected by the redox ability of the PEDOT:PSS.

The main difference between discolorations of ITO and PEDOT is that bluing of PEDOT can be reversed and reset (under most conditions) while yellowing of ITO is cumulative and permanent. It has been observed that PEDOT reverts to being transparent and regains its conductivity if 1) it is imbalanced in the opposed direction 2) after balanced switching 3) allowing for discharge of the electrode by shorting the display. Displays imbalanced with 6V at 50% duty cycles for 240 hours reverted back to original state within an hour of balanced switching.

Although the foregoing discussion has concentrated on the use of the first sub-assembly of the present invention as the front electrode of a display, the first sub-assembly can also form part of the backplane, since rear (pixel) electrodes may be subject to the same problems as front electrodes. Thus, for example an ITO or other pixel electrode subject to degradation may be coated with a conductive polymer in the same way as already described for front electrodes. Patterning of the conductive polymer will be required since the conductive polymer layer must not short adjacent pixel electrodes. Alternatively, the conductive polymer may formulated on to or into the lamination adhesive layer adjacent the backplane.

It will readily be apparent to those skilled in the technology of electro-optic displays that the sub-assemblies of the present invention may be regarded as examples of a broader concept of an electrode sub-assembly comprising a substrate and primary and secondary conductor layers. The function of the primary conductor layer is to have low resistance to allow in-plane conduction across the display and allow substantial voltage to be applied across the electro-optic layer. The desirable characteristics of the secondary conductor layer are (at least in principle): (a) sufficient conductivity at least in the normal (z-axis) direction to provide minimum voltage drop across the secondary conductor itself and maximum voltage drop across the electro-optic layer' (b) transparency and low light scattering; (c) being a source and reservoir for electrons thus allowing transfer of electrons between itself and the primary conductor layer to prevent excess or deficiency of electrons from changing the chemical structure of the primary conductor layer; (d) to act as a source and reservoir of ions thus allowing exchange of ions between itself and an adjacent layer of lamination adhesive to reduce remnant double layer voltage between the front electrode and the lamination adhesive; (e) to remain conductive and transparent even after the addition/removal of ions and electrons, or to incur only changes that can be reversed electrically; (f) not to interact with or change properties of the lamination adhesive layer; and (g) to be capable of being readily deposited on to the primary conductor layer.

It will be apparent to those skilled in the art that numerous changes and modifications can be made in the specific embodiments of the invention described above without departing from the scope of the invention. Accordingly, the whole of the foregoing description is to be interpreted in an illustrative and not in a limitative sense.

The invention claimed is:

1. A sub-assembly for use in an electro-optic display, the sub-assembly comprising in order:
an electrically non-conductive substrate;
a lamination adhesive layer;
a light-transmissive electrically-conductive ceramic layer; and
a light-transmissive non-ceramic electrically-conductive layer comprising a material selected from the group consisting of conductive organic polymers and solution-processable conductors, the light transmissive non-ceramic electrically-conductive layer positioned between the light transmissive electrically-conductive ceramic layer and the lamination adhesive layer.

2. A sub-assembly according to claim 1 wherein the electrically non-conductive substrate is light-transmissive.

3. A sub-assembly according to claim 1 wherein the conductive organic polymer comprises a polythiophene or polyaniline.

4. A sub-assembly according to claim 3 wherein the conductive organic polymer comprises poly(3,4-ethylenedioxy)thiophene polystyrene sulfonate.

5. A sub-assembly according to claim 1 wherein the solution-processable conductor comprises carbon nanotubes or silver nanowires.

6. A sub-assembly according to claim 1 further comprising a color filter array.

7. A sub-assembly according to claim 1 further comprising an electro-optic layer on the opposed side of the light-transmissive non-ceramic electrically-conductive layer from the light-transmissive electrically-conductive ceramic layer.

8. A sub-assembly according to claim 7 wherein the electro-optic material comprises a rotating bichromal member, electrochromic or electro-wetting material.

9. A sub-assembly according to claim 7 wherein the electro-optic material comprises an electrophoretic material comprising a plurality of electrically charged particles disposed in a fluid and capable of moving through the fluid under the influence of an electric field.

10. A sub-assembly according to claim 9 wherein the electrically charged particles and the fluid are confined within a plurality of capsules or microcells, or are present as a plurality of discrete droplets surrounded by a continuous phase comprising a polymeric material.

11. A sub-assembly according to claim 9 wherein the fluid is gaseous.

12. A front plane laminate, inverted front plane laminate or electro-optic display incorporating a sub-assembly according to claim 1.

13. An electronic book reader, portable computer, tablet computer, cellular telephone, smart card, sign, watch, shelf label, variable transmission window or flash drive comprising a display according to claim 12.

* * * * *